United States Patent [19]
Takahashi et al.

[11] Patent Number: 5,835,275
[45] Date of Patent: Nov. 10, 1998

[54] CATADIOPTRIC SYSTEM FOR PHOTOLITHOGRAPHY

[75] Inventors: Tetsuo Takahashi, Kawasaki; Yasuhiro Omura, Tokyo, both of Japan

[73] Assignee: Nikon Corporation, Tokyo, Japan

[21] Appl. No.: 883,748

[22] Filed: Jun. 27, 1997

[30] Foreign Application Priority Data

Jun. 28, 1996 [JP] Japan .................................. 8-188364

[51] Int. Cl.[6] ............................ G02B 27/14; G02B 17/00
[52] U.S. Cl. ........................................... 359/629; 359/727
[58] Field of Search .................................. 359/629, 631, 359/727, 728, 729, 730, 731, 364

[56] References Cited

U.S. PATENT DOCUMENTS

| 5,289,312 | 2/1994 | Hashimoto et al. | ................... 359/487 |
|---|---|---|---|
| 5,515,207 | 5/1996 | Foo | .......................................... 359/731 |
| 5,668,672 | 9/1997 | Oomura | ................................. 359/727 |
| 5,689,377 | 11/1997 | Takahashi | .............................. 359/727 |
| 5,742,436 | 4/1998 | Furter | ...................................... 359/727 |

*Primary Examiner*—Georgia Y. Epps
*Assistant Examiner*—Ricky Mack
*Attorney, Agent, or Firm*—Klarquist Sparkman Campbell Leigh & Whinston, LLP

[57] ABSTRACT

Catadioptric systems are provided, comprising a first imaging system, a plane mirror, and a second imaging system. The first imaging system comprises a single-pass optical system and a double-pass optical system that further comprises a concave mirror and a double-pass lens group. The second imaging system comprises a plane mirror and an aperture. The first imaging system forms an intermediate image of an object; the second imaging system re-images the intermediate image on a substrate. The catadioptric systems satisfy various conditions.

7 Claims, 5 Drawing Sheets

CATADIOPTRIC SYSTEM FOR PHOTOLITHOGRAPHY

FIELD OF THE INVENTION

The present invention pertains to catadioptric systems for photolithography and in particular, to high-resolution catadioptric systems for use with short-wavelength illumination.

BACKGROUND OF THE INVENTION

Catadioptric optical systems such as those disclosed in Japanese patent document 234722 (1992) and U.S. Pat. No. 4,779,966 have been developed to correct field curvature in photolithography systems. In these catadioptric systems, a first imaging system containing a concave mirror forms an intermediate image of a reticle. A plane mirror directs a light flux from the intermediate image to a second imaging system that re-images the intermediate image onto a wafer. These catadioptric systems have only one plane mirror and the reticle and the wafer are not parallel, thereby complicating synchronous scan of the reticle and the wafer. Other catadioptric systems have been developed wherein the second imaging system comprises a second plane mirror, permitting the reticle and the wafer to be parallel.

In general, catadioptric optical systems with tilted plane mirrors exhibit large aberrations unless the tilts of the plane mirrors are fixed precisely with respect to other portions of the optical system. In catadioptric systems that produce high-resolution images, the angular alignment tolerances of the plane mirrors must be very small and catadioptric system assembly is difficult.

SUMMARY OF THE INVENTION

Catadioptric systems according to the present invention have relaxed angular alignment tolerances for the plane mirrors or other reflecting surfaces that permit the reticle and wafer to be in parallel planes. Catadioptric systems according to the present invention preferably comprise, from objectwise to imagewise, a first imaging system comprising a single-pass optical system and a double-pass optical system, and a second imaging system. The double-pass optical system comprises, from objectwise to imagewise, a double-pass lens group and a concave mirror.

The single-pass optical system receives a light flux from an object, e.g., a reticle, and transmits the light flux to the double-pass optical system. The double-pass lens group receives the light flux from the single-pass optical system and transmits the light flux to the concave mirror. The concave mirror reflects the light flux back through the double-pass lens group and an intermediate image is formed. A first plane mirror or other reflector placed near the intermediate image reflects the light flux to the second imaging system and a image of the reticle in formed, generally on the surface of a wafer or other substrate.

The second imaging system preferably comprises a first lens group and a second lens group. In addition, the catadioptric systems preferably comprise a second plane mirror or other reflector and an aperture. The second plane mirror and the aperture preferably satisfy at least one of the conditions:

$$L_1/L < 0.1$$

$$L_1/L_2 < 0.2$$

wherein $L_1$ is the axial distance from the second plane mirror to the aperture, L is the axial distance from the reticle, or other object, to the wafer, or other image location, and $L_2$ is the axial distance from the first plane mirror to the wafer W, or other image location.

The catadioptric systems preferably satisfy the condition:

$$|L_1/f_1| < 1.5$$

wherein $f_1$ is the focal length of the second lens group of the second imaging system.

It is further preferable that the catadioptric systems satisfy the condition:

$$|\beta_1| < 0.2$$

wherein $\beta_1$ is the magnification of the second lens group of the second imaging system.

The foregoing and other objects, features, and advantages of the invention will become more apparent from the following detailed description of a preferred embodiment which proceeds with reference to the accompanying drawings.

BRIEF DESCRIPTION OF THE DRAWINGS

FIG. 2(a) depicts transverse aberrations at an image height of Y=18.6 mm. FIG. 2(b) depicts transverse aberrations at an image height of Y=5 mm.

FIG. 4(a) depicts transverse aberrations at an image height of Y=18.6 mm. FIG. 4(b) depicts transverse aberrations at an image height of Y=5 mm.

DETAILED DESCRIPTION

For convenience in describing the Example Embodiments, an axis is a line or connected series of line segments through a center of curvature of a reflecting or refracting surface. As is well-known, optical systems with tilted reflecting surfaces have optical axes consisting of connected line segments. Directions along an axis toward an object or an image are called "objectwise" and "imagewise," respectively.

Figure 1:
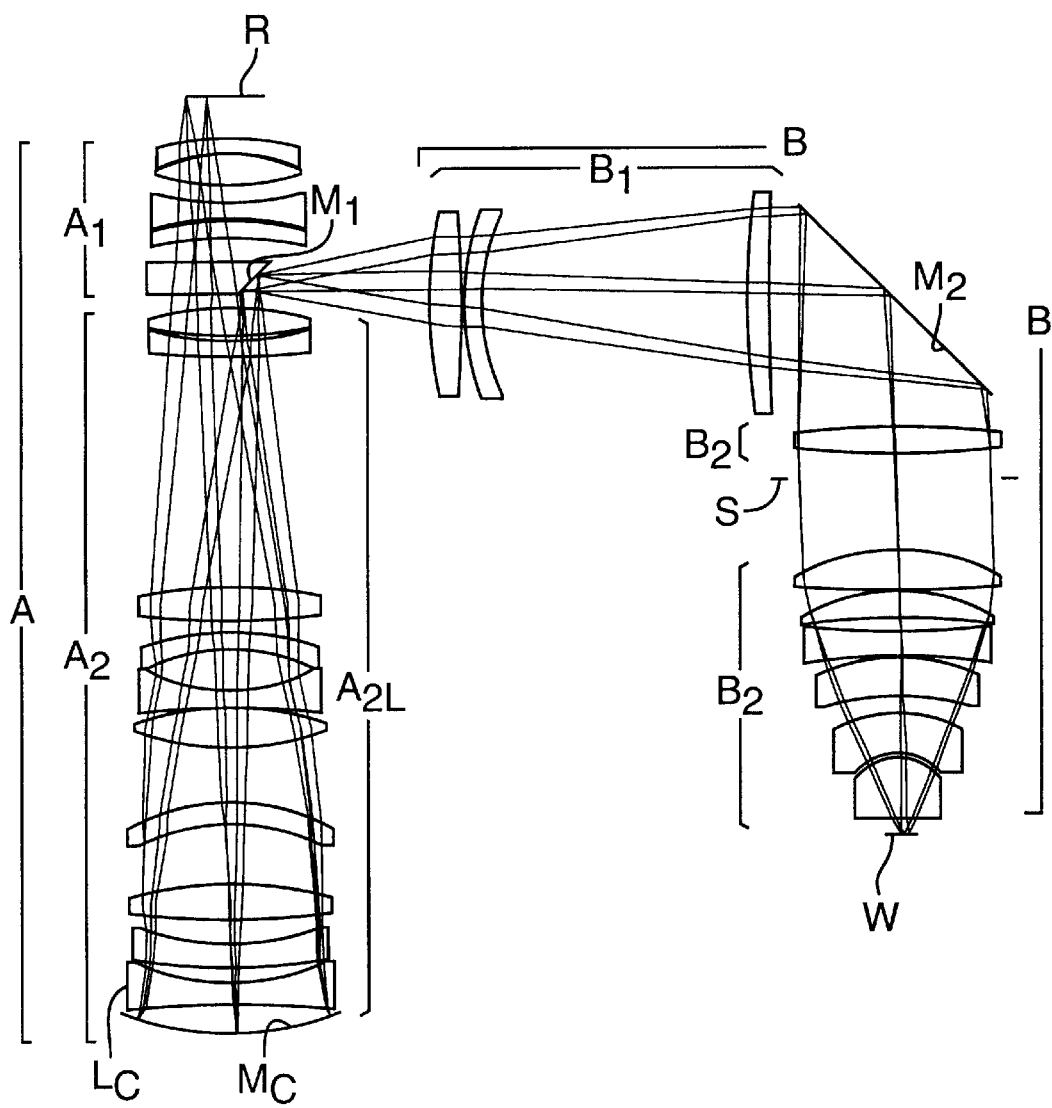
FIG. 1 is a schematic optical diagram of a catadioptric system according to Example Embodiment 1.
Figure 3:
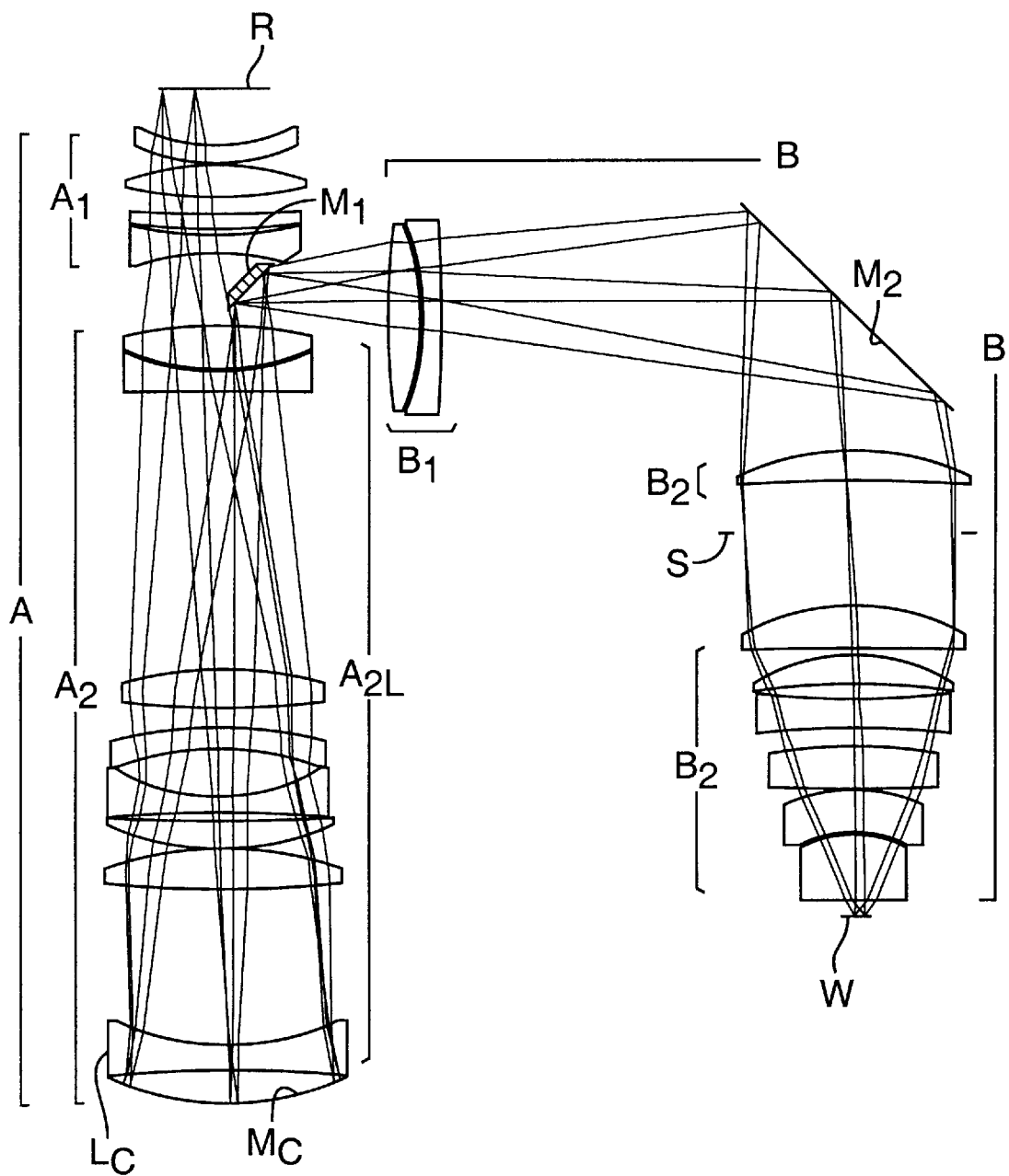
FIG. 3 is a schematic optical diagram of a catadioptric system according to Example Embodiment 2.

With reference to FIG. 1 and FIG. 3, for example, catadioptric systems according to Example Embodiments 1–2, respectively, project a demagnified image of a reticle R, or other object, onto a wafer W, or other substrate. The catadioptric systems preferably comprise, from objectwise to imagewise, a first imaging system A that forms an intermediate image of the reticle R, a first plane mirror $M_1$ placed near the intermediate image, and a second imaging system B that re-images the intermediate image onto the wafer W.

The first imaging system A preferably comprises, from objectwise to imagewise, a single-pass optical system Al and a double-pass optical system $A_2$. The double-pass optical system $A_2$ preferably comprises, from the single-pass optical system $A_1$ and along an axis, a double-pass lens group $A_{2L}$ and a concave mirror $M_c$. The double-pass lens group $A_{2L}$ preferably comprises a concave lens $L_c$ placed axially adjacent the concave mirror $M_c$.

The second imaging system B preferably comprises, from objectwise to imagewise, a first lens group $B_1$ and a second lens group $B_2$. The second imaging system further comprises an aperture S. In addition, the second imaging system comprises a second plane mirror $M_2$ between the first lens group $B_1$ and the second lens group $B_2$. In both Example Embodiments 1–2, the second plane mirror $M_2$ is objectwise of the aperture S, but the second plane mirror $M_2$ can be imagewise of the aperture S.

The single-pass optical system $A_1$ receives a light flux from the reticle R and directs the light flux to the double-pass optical system $A_2$. The double-pass lens group $A_{2L}$ transmits the light flux to the concave mirror $M_c$. The concave mirror $M_c$ receives the light flux and reflects the light flux back through the double-pass lens group $A_{2L}$. The light flux then exits the double-pass optical system $A_2$ and is directed by the first plane mirror $M_1$ to the second imaging system B.

The first lens group $B_1$ of the second imaging system B receives the light flux reflected by the first plane mirror $M_1$ and directs the light flux to the second plane mirror $M_2$. The second plane mirror $M_2$ then reflects the light flux to the second lens group $B_2$ and an image is formed on the wafer W.

The catadioptric systems of the preferred embodiments are suitable for photolithography systems in which the reticle R is scanned through an off-axis, slit or arc-shaped illumination region. Patterns from the entire reticle R are projected onto the wafer W by synchronously scanning the wafer W while projecting patterns from the reticle R as the reticle R scans through the illumination region.

The second plane mirror $M_2$ and the aperture S are preferably arranged to satisfy at least one of the following Conditional Expressions 1–2:

$$L_1/L < 0.1 \quad (1)$$

$$L_1/L_2 < 0.2 \quad (2)$$

wherein $L_1$ is the axial distance from the second plane mirror $M_2$ to the aperture S, L is the axial distance from the reticle R, or other object, to the wafer W, or other image location, and $L_2$ is the axial distance from the first plane mirror $M_1$ to the wafer W, or other image location. Because the second plane mirror $M_2$ is near the aperture S, the light flux reflected by the second plane mirror $M_2$ is substantially collimated. Off-axis aberrations such as coma, astigmatism, and distortion due to tilt of the second plane mirror $M_2$ are therefore reduced and tilt tolerances for the second plane mirror $M_2$ are relaxed. If Conditional Expressions 1–2 are not satisfied, then off-axis aberrations are unacceptably large.

Also, the catadioptric systems preferably satisfy Conditional Expression 3:

$$|L_1/f_1| < 1.5 \quad (3)$$

wherein $f_1$ is the focal length of the second lens group $B_2$ of the second imaging system B. Satisfying Conditional Expression 3 reduces aberrations in the second imaging system B. If Conditional Expression 3 is not satisfied, then $f_1$ is too small and correction of aberrations in the second imaging system B is difficult.

It is further preferable that Conditional Expression 4 be satisfied:

$$|L_1/f_1| < 1.5 \quad (4)$$

wherein $\beta_1$ is the magnification of the second lens group $B_2$ of the second imaging system B. Satisfying Conditional Expression 4 provides that the light flux at the second plane mirror $M_2$ is substantially collimated, i.e. an angular diameter of the light flux is less than the object-side numerical aperture. If Conditional Expression 4 is not satisfied, then the light flux has a large angular diameter and the second plane mirror $M_2$ tends to reflect the light flux non-uniformly.

Tables 1–2 contain specifications for the catadioptric systems of Example Embodiments 1–2, respectively. In Tables 1–2, the first column lists surfaces numbered in order from objectwise to imagewise along an axis along which the light flux from the reticle R propagates; the second column, labeled "r," lists corresponding curvature radii; the third column, labeled "d," lists axial separations between adjacent, imagewise surfaces; the fourth column, labeled "Material," lists lens materials; and the fifth column, labeled "Group," lists the group number of the surfaces. In the fifth column, a "*" indicates a surface of the double-pass optical system A2 encountered by a light flux after reflection from the concave mirror $C_m$. Refractive indices of fused silica ($SiO_2$) and fluorite ($CaF_2$) at a wavelength of 193 nm are n=1.56019 and n=1.50138, respectively.

Table 3 contains values of the Conditional Expressions 1–4 and values of $L_1$, L, $L_2$, and f1 for Example Embodiments 1–2.

Figure 2A:
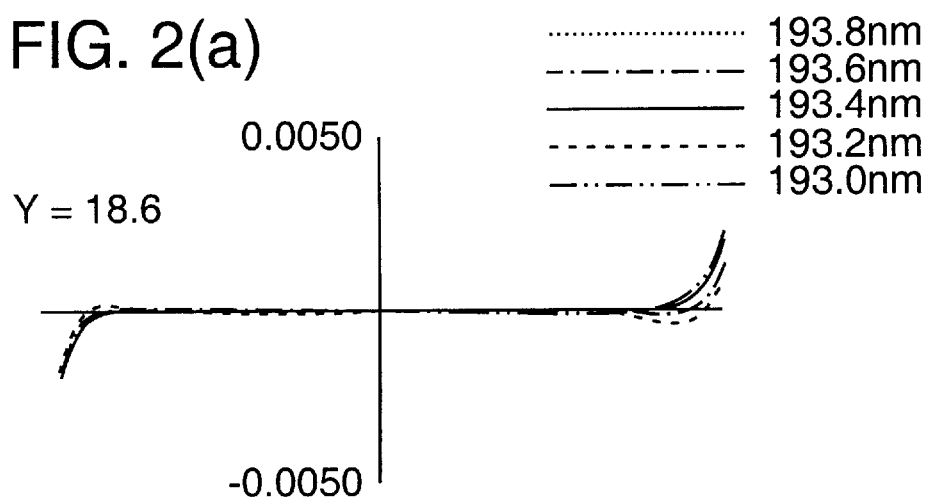
FIGS. 2(a)–2(b) are plots of transverse aberrations exhibited by Example Embodiment 1.
Figure 2B:
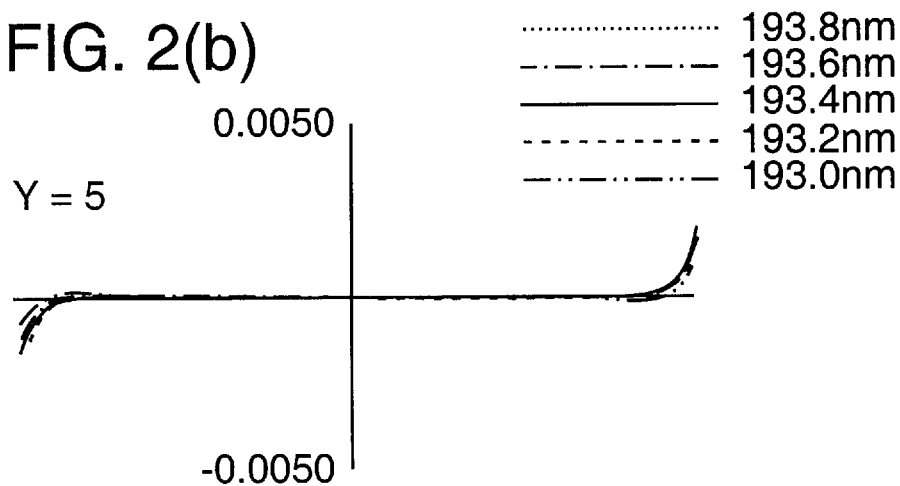
Figure 4A:
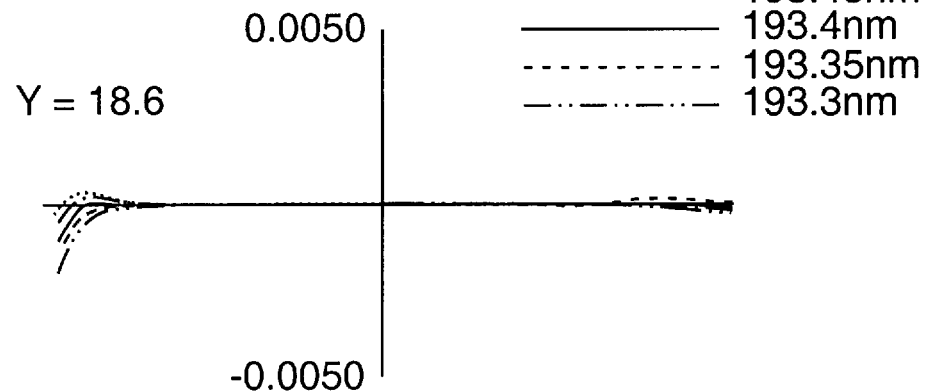
FIGS. 4(a)–4(b) are plots of transverse aberrations exhibited by Example Embodiment 2.
Figure 4B:
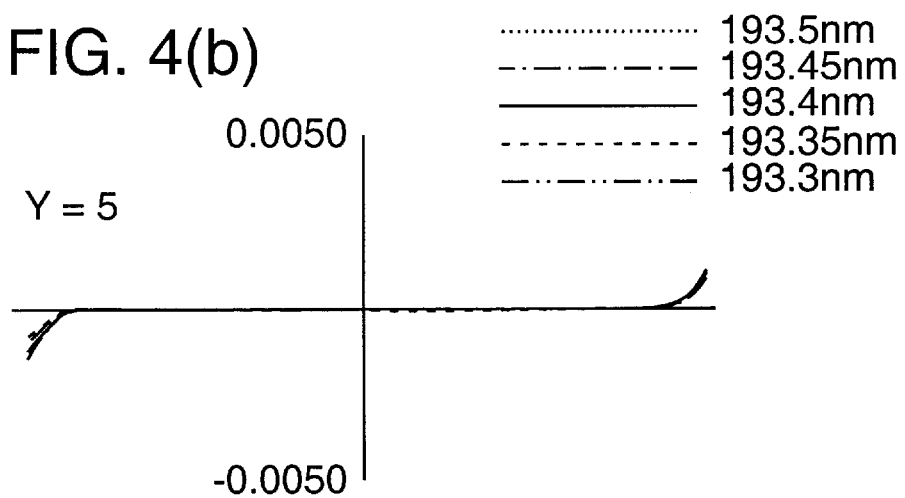

With reference to FIG. 2 and FIG. 4, it is apparent that the catadioptric systems are well-corrected for aberrations over a wavelength range of 193.4 nm±0.1 nm at image heights of Y=18.6 mm and Y=5 mm.

TABLE 1

(Example Embodiment 1)

| Surf. No. | r (mm) | d (mm) | Material | Group |
|---|---|---|---|---|
| 0 | — | 49.998 | | R |
| 1 | 369.115 | 18.000 | $SiO_2$ | $A_1$ |
| 2 | 245.893 | 0.500 | | |
| 3 | 227.674 | 33.705 | $CaF_2$ | $A_1$ |
| 4 | −373.082 | 18.803 | | |
| 5 | −324.258 | 20.532 | $SiO_2$ | $A_1$ |
| 6 | 332.817 | 1.674 | | |
| 7 | 340.581 | 20.389 | $SiO_2$ | $A_1$ |
| 8 | 604.750 | 27.395 | | |
| 9 | ∞ | 35.900 | $SiO_2$ | $A_1$ |
| 10 | ∞ | 16.943 | | |
| 11 | 391.176 | 30.000 | $CaF_2$ | $A_2$ |
| 12 | −982.727 | 6.592 | | |
| 13 | −417.793 | 20.000 | $SiO_2$ | $A_2$ |
| 14 | −1216.731 | 261.353 | | |
| 15 | 478.547 | 40.000 | $CaF_2$ | $A_2$ |
| 16 | −908.632 | 11.323 | | |
| 17 | 325.213 | 20.000 | $SiO_2$ | $A_2$ |
| 18 | 208.331 | 48.917 | | |
| 19 | −196.257 | 20.000 | $SiO_2$ | $A_2$ |
| 20 | 1370.871 | 0.500 | | |
| 21 | 430.209 | 42.793 | $CaF_2$ | $A_2$ |
| 22 | −366.694 | 61.625 | | |
| 23 | 247.465 | 25.000 | $SiO_2$ | $A_2$ |
| 24 | 286.274 | 68.753 | | |
| 25 | 508.228 | 40.000 | $SiO_2$ | $A_2$ |
| 26 | −930.828 | 27.931 | | |
| 27 | −313.824 | 25.000 | $SiO_2$ | $A_2$ |
| 28 | −1017.267 | 19.454 | | |
| 29 | −276.064 | 25.000 | $SiO_2$ | $A_2$ |
| 30 | 1335.454 | 32.821 | | |
| 31 | −360.416 | 32.821 | | $A_2$ ($M_c$) |
| 32 | 1335.454 | 25.000 | $SiO_2$ | $A_2$* |
| 33 | −276.064 | 19.454 | | |
| 34 | −1017.267 | 25.000 | $SiO_2$ | $A_2$* |
| 35 | −313.824 | 27.931 | | |

TABLE 1-continued (Example Embodiment 1)

| Surf. No. | r (mm) | d (mm) | Material | Group |
|---|---|---|---|---|
| 36 | −930.828 | 40.000 | SiO$_2$ | A$_2$. |
| 37 | 508.228 | 68.753 | | |
| 38 | 286.274 | 25.000 | SiO$_2$ | A$_2$. |
| 39 | 247.465 | 61.625 | | |
| 40 | −366.694 | 42.793 | CaF$_2$ | A$_2$. |
| 41 | 430.209 | 0.500 | | |
| 42 | 1370.871 | 20.000 | SiO$_2$ | A$_2$. |
| 43 | −196.257 | 48.917 | | |
| 44 | 208.331 | 20.000 | SiO$_2$ | A$_2$. |
| 45 | 325.213 | 11.323 | | |
| 46 | −908.632 | 40.000 | CaF$_2$ | A$_2$. |
| 47 | 478.547 | 261.353 | | |
| 48 | −1216.731 | 20.000 | SiO$_2$ | A$_2$. |
| 49 | −417.793 | 6.592 | | |
| 50 | −982.727 | 30.000 | CaF$_2$ | A$_2$. |
| 51 | 391.176 | 1.943 | | |
| 52 | ∞ | 236.637 | | M$_1$ |
| 53 | 471.443 | 36.090 | CaF$_2$ | B$_1$ |
| 54 | −1089.261 | 3.979 | | |
| 55 | 306.858 | 20.000 | SiO$_2$ | B$_1$ |
| 56 | 247.195 | 312.806 | | |
| 57 | 812.165 | 25.000 | SiO$_2$ | B$_1$ |
| 58 | 2628.418 | 145.000 | | |
| 59 | ∞ | 145.508 | | M$_2$ |
| 60 | −1094.809 | 30.000 | SiO$_2$ | B$_2$ |
| 61 | 1598.936 | 30.114 | | |
| 62 | — | 81.437 | | S |
| 63 | −266.544 | 45.218 | CaF$_2$ | B$_2$ |
| 64 | 2115.935 | 0.550 | | |
| 65 | −213.134 | 30.096 | SiO$_2$ | B$_2$ |
| 66 | −642.205 | 15.142 | | |
| 67 | 1328.716 | 30.000 | SiO$_2$ | B$_2$ |
| 68 | −654.044 | 1.236 | | |
| 69 | −210.004 | 45.167 | SiO$_2$ | B$_2$ |
| 70 | −304.557 | 19.703 | | |
| 71 | −166.497 | 45.000 | SiO$_2$ | B$_2$ |
| 72 | −72.336 | 6.218 | | |
| 73 | −71.786 | 66.262 | SiO$_2$ | B$_2$ |
| 74 | 2042.086 | 17.000 | | |
| 75 | — | | | W |

TABLE 2

(Example Embodiment 2)

| Surf. No. | r (mm) | d (mm) | Material | Group |
|---|---|---|---|---|
| 0 | — | 60.000 | | R |
| 1 | −210.000 | 18.000 | SiO$_2$ | A$_1$ |
| 2 | −233.058 | 1.734 | | |
| 3 | 301.818 | 32.109 | CaF$_2$ | A$_1$ |
| 4 | −415.393 | 19.449 | | |
| 5 | 154862.242 | 15.248 | SiO$_2$ | A$_1$ |
| 6 | −528.109 | 5.460 | | |
| 7 | −316.309 | 18.000 | SiO$_2$ | A$_1$ |
| 8 | 275.570 | 74.064 | | |
| 9 | 342.313 | 48.000 | CaF$_2$ | A$_2$ |
| 10 | −248.024 | 1.806 | | |
| 11 | −250.000 | 20.000 | SiO$_2$ | A$_2$ |
| 12 | 3438.110 | 286.849 | | |
| 13 | 390.013 | 40.000 | CaF$_2$ | A$_2$ |
| 14 | −2017.162 | 22.849 | | |
| 15 | 421.041 | 20.000 | SiO$_2$ | A$_2$ |
| 16 | 230.317 | 47.916 | | |
| 17 | −222.542 | 20.000 | SiO$_2$ | A$_2$ |
| 18 | 988.626 | 7.270 | | |
| 19 | 11949.023 | 27.617 | CaF$_2$ | A$_2$ |
| 20 | −328.913 | 0.500 | | |
| 21 | 365.306 | 42.285 | SiO$_2$ | A$_2$ |
| 22 | −1713.365 | 160.144 | | |

TABLE 2-continued (Example Embodiment 2)

| Surf. No. | r (mm) | d (mm) | Material | Group |
|---|---|---|---|---|
| 23 | −283.704 | 30.000 | SiO$_2$ | A$_2$ |
| 24 | 1076.349 | 30.701 | | |
| 25 | −353.136 | 30.701 | | A$_2$ (M$_c$) |
| 26 | 1076.349 | 30.000 | SiO$_2$ | A$_2$. |
| 27 | −283.704 | 160.144 | | |
| 28 | −1713.365 | 42.285 | SiO$_2$ | A$_2$. |
| 29 | 365.306 | 0.500 | | |
| 30 | −328.913 | 27.617 | CaF$_2$ | A$_2$. |
| 31 | −11949.023 | 7.270 | | |
| 32 | 988.626 | 20.000 | SiO$_2$ | A$_2$. |
| 33 | −222.542 | 47.916 | | |
| 34 | 230.317 | 20.000 | SiO$_2$ | A$_2$. |
| 35 | 421.041 | 22.849 | | |
| 36 | −2017.162 | 40.000 | CaF$_2$ | A$_2$. |
| 37 | 390.013 | 286.849 | | |
| 38 | 3438.110 | 20.000 | SiO$_2$ | A$_2$. |
| 39 | −250.000 | 1.806 | | |
| 40 | −248.024 | 48.000 | CaF$_2$ | A$_2$. |
| 41 | 342.313 | 4.064 | | |
| 42 | ∞ | 180.000 | | M$_1$ |
| 43 | 506.214 | 34.041 | CaF$_2$ | B$_1$ |
| 44 | −256.332 | 3.017 | | |
| 45 | −450.000 | 20.000 | SiO$_2$ | B$_1$ |
| 46 | −1453.242 | 422.966 | | |
| 47 | ∞ | 150.000 | | M$_2$ |
| 48 | −285.380 | 30.000 | SiO$_2$ | B$_2$ |
| 49 | −954.824 | 50.000 | | |
| 50 | — | 78.332 | | S |
| 51 | −220.000 | 45.000 | CaF$_2$ | B$_2$ |
| 52 | −2665.536 | 6.535 | | |
| 53 | −200.000 | 27.411 | SiO$_2$ | B$_2$ |
| 54 | −516.467 | 18.844 | | |
| 55 | 632.373 | 30.000 | SiO$_2$ | B$_2$ |
| 56 | −1060.585 | 19.112 | | |
| 57 | −553.788 | 45.000 | SiO$_2$ | B$_2$ |
| 58 | 5823.302 | 0.500 | | |
| 59 | −153.299 | 45.000 | SiO$_2$ | B$_2$ |
| 60 | −120.000 | 1.243 | | |
| 61 | −125.615 | 66.000 | SiO$_2$ | B$_2$ |
| 62 | 3036.218 | 17.000 | | |
| 63 | — | | | W |

TABLE 3

Values of Conditional Expressions

| Variables and Conditions | Example Embodiment 1 | Example Embodiment 2 |
|---|---|---|
| L$_1$ (mm) | 205.6 | 230.0 |
| L (mm) | 3287.2 | 3150.0 |
| L$_2$ (mm) | 1388.2 | 1290.0 |
| f$_1$ (mm) | 192.0 | 207.5 |
| (1) L$_1$/L | 0.06 | 0.07 |
| (2) L$_1$/L$_2$ | 0.15 | 0.18 |
| (3) |L$_1$/f$_1$| | 1.07 | 1.11 |
| (4) |β$_1$| | 0.1409 | 0.1932 |

In Example Embodiment 1, the second mirror M$_2$ is placed 205.6 mm objectwise of the aperture S; in Example Embodiment 2, the second mirror M$_2$ is 230 mm objectwise of the aperture S. As a result, coma, astigmatism, and distortion due to tilt of the plane mirror M$_2$ are small, thereby simplifying the fabrication of a high-resolution catadioptric system. In addition, irregular reflectance of the second mirror M$_2$ is reduced.

In both Example Embodiments 1–2, the second plane mirror M$_2$ is objectwise of the aperture S. However, the second plane mirror M$_2$ can be imagewise of the aperture S so long as Conditional Expressions 1–4 are satisfied.

Figure 5:
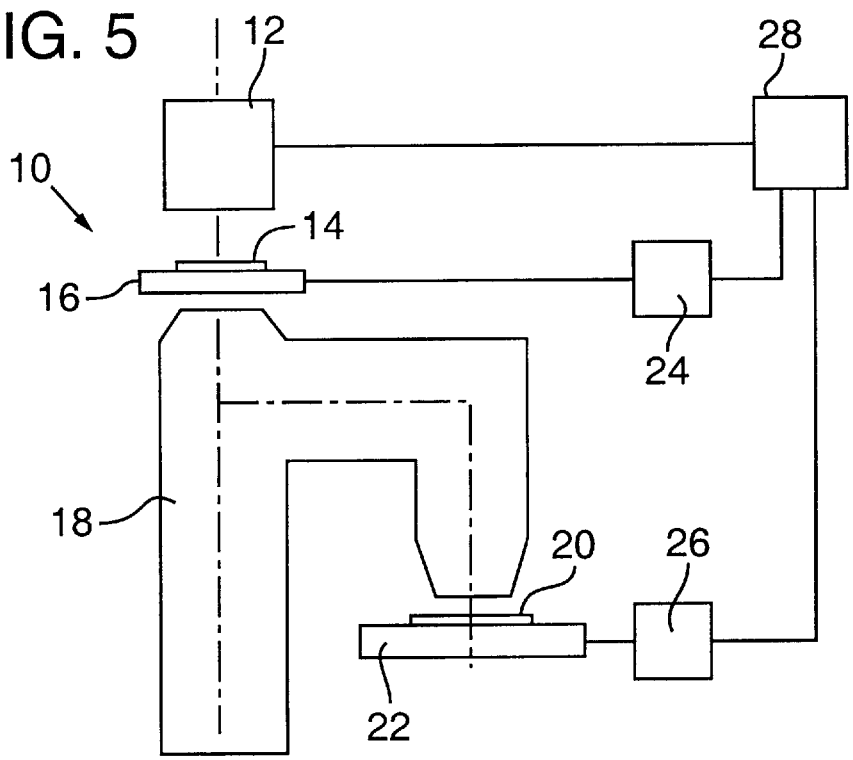
FIG. 5 is a schematic elevational view of a projection-exposure apparatus comprising a catadioptric system according to the invention.

A representative projection-exposure (microlithography) apparatus 10 comprising a catadioptric system as described above is schematically illustrated in FIG. 5. The apparatus 10 comprises an illumination optical system 12, a reticle or "mask" 14 defining a pattern for projection, a reticle stage 16 for holding the reticle, a catadioptric system 18 as described above, a photosensitive substrate 20 onto which the catadioptric system projects an image of the pattern defined by the mask 14, a substrate stage 22 for holding the substrate 20, a driver 24 for moving the reticle stage 16 as required during or between exposures, a driver 26 for moving the substrate stage 22 as required during or between exposures, and a controller 28 for controlling operation of the entire apparatus 10.

Having illustrated and demonstrated the principles of the invention in example embodiments, it should be apparent to those skilled in the art that the example embodiments can be modified in arrangement and detail without departing from such principles. For example, other reflecting elements such as prisms can be substituted for the first plane mirror $M_1$ or the second plane mirror $M_2$ of Example Embodiments 1–2. I claim as the invention all that comes within the scope of these claims.

What is claimed is:

1. A catadioptric system for projecting an image of an object onto a substrate, the catadioptric system comprising, from objectwise to imagewise:

(a) a first imaging system having an optical axis and comprising a single-pass optical system and a double-pass optical system, the double-pass optical system comprising a concave mirror and a double-pass lens group, a light flux from the object being received by the single-pass optical system and directed to the double-pass lens group, the double-pass lens group directing the light flux to the concave mirror that reflects the light flux back through the double-pass lens group, thereby forming an intermediate image of the object;

(b) a first plane reflector receiving the light flux from the double-pass lens group;

(c) a second imaging system receiving the light flux from the first plane reflector and forming an image of the object on the substrate, the second imaging system comprising, from objectwise to imagewise, a first lens group, a second plane reflector, and a second lens group, wherein an aperture is disposed in the second lens group and the second plane reflector is disposed between the first lens group and the second lens group;

(d) the catadioptric system satisfying at least one of the following conditions:

$L_1/L < 0.1$ $L_1/L_2 < 0.2$ wherein $L_1$ is an axial distance from the second plane reflector to the aperture, L is an axial distance from the object to the substrate, and $L_2$ is an axial distance from the first plane reflector to the substrate.

2. The catadioptric system of claim 1, further satisfying the condition:

$|\beta_1| < 0.2$ wherein $\beta_1$ is a magnification of the second lens group of the second imaging system.

3. The catadioptric system of claim 1, further satisfying the condition:

$|L_1/f_1| < 1.5$ wherein $f_1$ is a focal length of the second lens group of the second imaging system.

4. The catadioptric system of claim 3, further satisfying the condition:

$|\beta_1| < 0.2$ wherein $\beta_1$ is a magnification of the second lens group of the second imaging system.

5. A catadioptric system for projecting an image of an object onto a substrate, the catadioptric system comprising, from objectwise to imagewise:

(a) a first imaging system comprising a single-pass optical system and a double-pass optical system, the double-pass optical system comprising a concave mirror and a double-pass lens group, a light flux from the object being received by the single-pass optical system and directed to the double-pass lens group, the double-pass lens group directing the light flux to the concave mirror that reflects the light flux back through the double-pass lens group, thereby forming an intermediate image of the object;

(b) a first plane reflector receiving the light flux from the double-pass lens group;

(c) a second imaging system receiving the light flux from the first plane reflector and forming an image of the object on the substrate, the second imaging system comprising a second plane reflector and an aperture;

(d) the catadioptric system satisfying at least one of the following conditions:

$L_1/L < 0.1$ $L_1/L_2 < 0.2$ wherein $L_1$ is an axial distance from the second plane reflector to the aperture, L is an axial distance from the object to the substrate, and $L_2$ is an axial distance from the first plane reflector to the substrate.

6. A projection-exposure apparatus, comprising a catadioptric system as recited in claim 1.

7. A projection-exposure apparatus, comprising a catadioptric system as recited in claim 5.

* * * * *

UNITED STATES PATENT AND TRADEMARK OFFICE
CERTIFICATE OF CORRECTION

PATENT NO. : 5,835,275
DATED : November 10, 1998
INVENTOR(S) : Takahashi, et. al.

It is certified that error appears in the above-indentified patent and that said Letters Patent is hereby corrected as shown below:

Column 1, line 54, "in" should be --is--.

Column 2, line 63, "A1" should be --$A_1$--.

Column 3, line 66, Conditional Expression 4, "$|L_1/f_1| < 1.5$" should be --$|\beta_1| < 0.2$--.

Column 4, line 20, "A2" should be --$A_2$--.

Column 4, line 21, "$C_m$" should be --$M_c$--.

Column 4, line 25, "f1" should be --$f_1$--.

Column 4, line 45, Table 1, Surface No. 9, "35.900" should be --35.000--.

Column 8, line 47, claim 5, "$L_l/L_2 < 0.2$" should be --$L_1/L_2 < 0.2$--.

Signed and Sealed this

Sixteenth Day of November, 1999

Attest:

Q. TODD DICKINSON

*Attesting Officer*   *Acting Commissioner of Patents and Trademarks*